(12) United States Patent
Minda

(10) Patent No.: US 7,221,054 B2
(45) Date of Patent: May 22, 2007

(54) BUMP STRUCTURE

(75) Inventor: Hiroyasu Minda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 176 days.

(21) Appl. No.: 11/133,279

(22) Filed: May 20, 2005

(65) Prior Publication Data

US 2005/0258539 A1 Nov. 24, 2005

(30) Foreign Application Priority Data

May 20, 2004 (JP) ............... 2004-150726

(51) Int. Cl.
*H01L 23/48* (2006.01)
*H01L 23/52* (2006.01)
*H01L 29/40* (2006.01)
(52) U.S. Cl. ...................... 257/738; 257/780
(58) Field of Classification Search ............... 257/737, 257/738, 779, 780, 781
See application file for complete search history.

(56) References Cited

U.S. PATENT DOCUMENTS 6,891,274 B2 * 5/2005 Chen et al. ................. 257/780
7,064,446 B2 * 6/2006 Barnak et al. ............... 257/779

FOREIGN PATENT DOCUMENTS

JP 2001-93928 4/2001

* cited by examiner

*Primary Examiner*—Hoai Pham
(74) *Attorney, Agent, or Firm*—Young & Thompson

(57) ABSTRACT

A semiconductor device, which is capable of suppressing interfacial breakdown between a solder ball and a conductive film, is provided. The semiconductor device of the present invention, when "a" is distance between a terminal part of the solder ball 108 in a face coming into contact with an insulating resin layer 105 and an upper periphery of a via 104, and "b" is distance between a terminal part of the UBM film 107 and the upper periphery of the via 104, the semiconductor device is made to fulfill with 0<a/b≦2.

16 Claims, 16 Drawing Sheets

BUMP STRUCTURE

This application is based on Japanese patent application NO. 2004-150726, the content of which is incorporated hereinto by reference.

BACKGROUND OF THE INVENTION

1. Field of the Invention

The present invention relates to a semiconductor device provided with a bump structure used for a flip-chip mounting.

2. Description of Related Art

In recent years, promoted energetically is realization of lead-free in design of the soldering for flip-chip mounting while taking into consideration of environmental problems.

As for lead-free solders, there is indicated the lead-free solder, which contains Sn, Ag and Cu. On the contrary, when forming a solder ball on a pad using such solders, in some cases, interfacial breakdown occurs between the pad and the solder ball.

Japanese Laid-Open Patent Publication No. 2001-93928 proposes technology to suppress such interfacial breakdown. According to the technology described in the Japanese Laid-Open Patent Publication No. 2001-93928, there is concluded that the intermetallic compound is the factor, which causes the interfacial breakdown of the solder ball to occur. From this viewpoint, the copper diffusion prevention film such as Ni, Cr or the like is formed on the copper pad so that the copper is prevented from reaching the surface of the solder ball while the copper being diffused. In such a way as above, this enhances reliability of the semiconductor device while preventing interfacial breakdown from occurring at the interface between the copper pad and the solder ball.

However, even the technology described in the Japanese Laid-Open Patent Publication No. 2001-93928, there is still room for further improvement on the point such as solder bump adhesion or the like. In addition, in the technology described in the same literature, it is necessary to form metal film such as Palladium film between the copper diffusion prevention film and the solder ball to ensure solder adhesion. However, in some cases, long term reliability of the pad portion cannot be obtained sufficiently.

In recent years, the case where the product is used under severe environment increases; and level of reliability required for the pad portion becomes higher.

In such a situation, new technology to suppress the interfacial breakdown and to improve reliability of the product is strongly required.

SUMMARY OF THE INVENTION

The present inventor has found that it is possible to suppress the interfacial breakdown effectively upon suitably designing shape factor of a bump part with discussions given energetically.

According to the present invention, there is provided a semiconductor device comprising an interconnection, an insulating film, which is provided above the interconnection, provided with a hole reaching the interconnection, a conductive film, which comes into contact with the interconnection in a bottom of the hole, formed across from the bottom of the hole to outside the hole, and a solder ball provided in contact with the conductive film and the insulating film, wherein when "a" is distance between a terminal part of the solder ball in a face coming into contact with the insulating film and an upper periphery of the hole, and "b" is depth of the hole, value of a/b is not more than 2.

In addition, according to the present invention, there is provided a semiconductor device comprising an interconnection, an insulating layer, which is constituted by forming a protection layer provided above the interconnection and a buffer resin layer provided above the protection film with layered structure in this order, provided with a hole reaching the interconnection, a conductive film coming into contact with the interconnection and extending outside the hole on the insulating layer, and a solder ball provided in contact with said conductive film and said buffer resin layer, wherein the conductive film includes a ball underlying metal film coming into contact with the solder ball, and a barrier metal film provided between the interconnection and the ball underlying metal film; when "c" is distance between a terminal part of the ball underlying metal film and an upper periphery of the hole, and "b" is depth of the hole, value of c/b is not more than 1.3.

According to the present invention, the shape factor of the bump part is suitably designed. Thereby, the semiconductor device with high reliability is provided while suppressing the interfacial breakdown between the solder ball and the conductive film.

According to the present invention, there is provided the semiconductor device with high reliability while suppressing the interfacial breakdown between the solder ball and the conductive film in the bump structure.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENT

Figure 1:
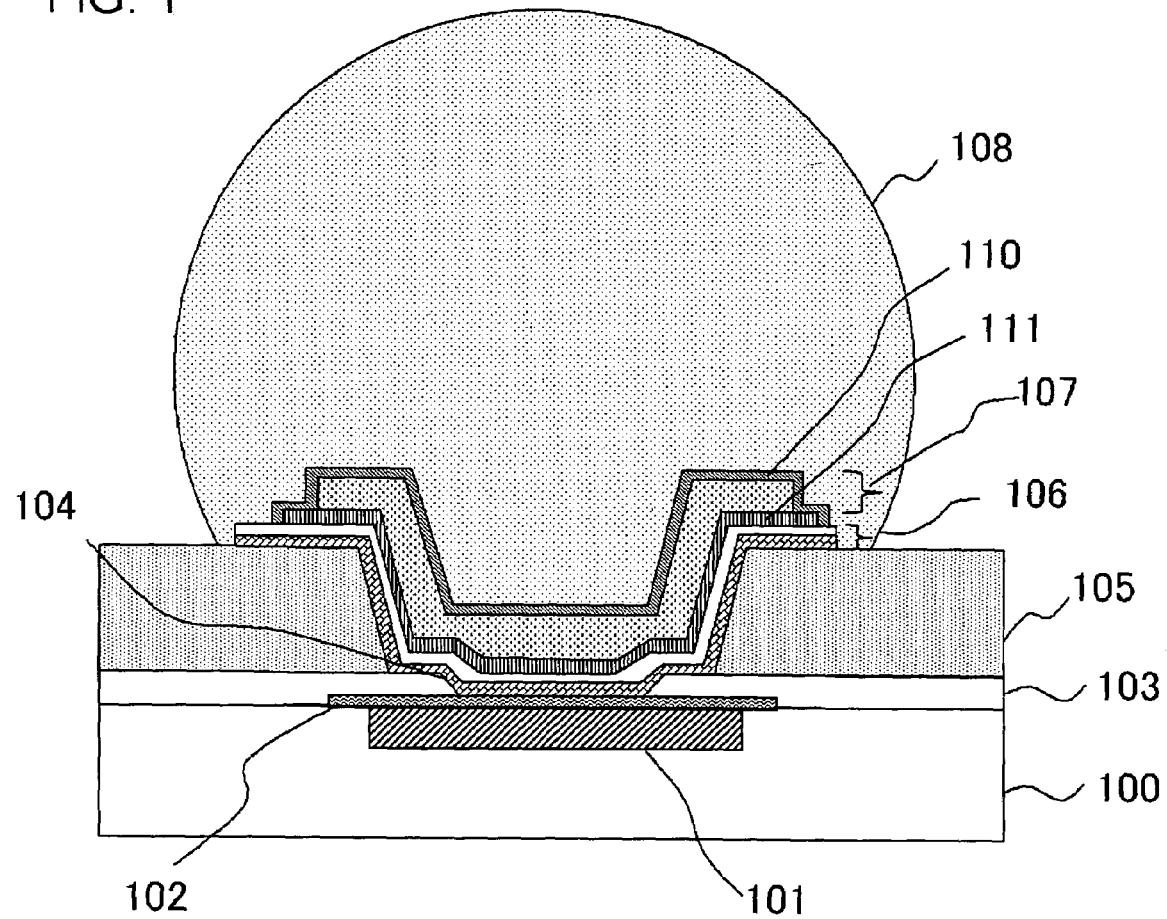
FIG. 1 is a diagram showing a principal part of s semiconductor device according to an embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposed.

Hereinafter, there will be described the semiconductor device according to the present invention in detail referring to the drawings. It should be noted that, in the description of the drawings, the same sign is added to the same element to omit the duplicated explanation.

(First Embodiment)

FIG. 1 is a diagram showing a principal part of the semiconductor device according to the first embodiment.

In FIG. 1, the semiconductor device comprises an uppermost layer interconnection 101, which is an interconnection electrically connecting to an internal circuit, a passivation film 103 and an insulating resin layer 105, which are provided above the uppermost layer interconnection 101 and form an insulating film provided with a via 104 to be a hole reaching this uppermost layer interconnection 101, a barrier metal film 106, a Cu film 111 and an UBM film 107 (under ball metal or under bump metal), which are connected to the uppermost layer interconnection 101 in a bottom of the via 104 and form a conductive film formed across from the bottom of the via 104 to outside the via 104, the solder ball 108 provided while coming into contact with the conductive film and the insulating film, and an alloy layer 110, which is formed on the interface between the solder ball 108 and the UBM film 107 and is formed on the interface between the solder ball 108 and the Cu film 111. The alloy layer 110 is constituted by containing a metallic element contained in the solder ball 108 and a metallic element contained in the conductive film.

The insulating resin layer 105 is provided in such a way as to come into contact with the solder ball 108, and performs work as a buffer layer to relax stress occurring at a forming process of the solder ball 108 and a manufacturing process after the solder ball forming process. As for the material of the insulating resin layer 105, it is possible to use polyimide, polybenzoxazole or the like. Although it is preferable that film thickness (finished dimension after baking described later) of the insulating resin layer 105 is made 1 to 10 µm, in the present embodiment, the film thickness is made 7 µm. An elastic modulus of the insulating resin layer 105 is preferably set to not less than 1 GPa, and more preferably set to not less than 2 GPa. In addition, the elastic modulus of the insulating resin layer is preferably set to not more than 5 GPa, and more preferably set to not more than 3.5 GPa. In such a way as above, there is obtained sufficient stress relaxing action.

The uppermost layer interconnection 101 is formed of conductive materials such as copper, aluminum, or an alloy thereof, and embedded in the insulating film 100. The cap layer 102 is provided between the uppermost layer interconnection 101 and an opening of the via 104. This uppermost layer interconnection 101 is connected to elements such as a transistor or the like constituting the semiconductor device. In addition, the uppermost layer interconnection 101 may have layered structure.

The cap layer 102 is formed of TiN, SiCN or the like, and when copper is used as uppermost layer interconnection 101, the cap layer 102 performs work to prevent copper from being diffused. The passivation film 103 formed in such a way as to cover the cap layer 102 is formed of SiON or the like, and effectively prevents moisture from entering the uppermost layer interconnection 101 and a circuit element with residing lower layer of the uppermost layer interconnection 101.

The barrier metal film 106 acts so as to prevent tin from being diffused from the solder ball 108. In addition, the barrier metal film 106 is formed in the shape that the barrier metal film is exposed outside the terminal than the UBM film 107 described later.

The UBM film 107 is a base film to form the solder ball 108, and an outermost surface of the UBM film 107 is formed in such a way as to contain a substance with excellent wettability to the solder, and the substance is capable of securing conductivity on the occasion of performing Ni plating, such as for instance, copper. Here, as for the metal contained in the outermost surface of the UBM film 107, copper (Cu), gold (Au), chromium (Cr) or the like are indicated; and the solder exhibits excellent wettability to these elements. An alloy layer 110 formed with a metallic element contained in the UBM film 107, a metallic element contained in the Cu film 111 and a metallic element contained in the solder ball 108 is formed at the interface between the UBM film 107 and the Cu film 111, and the solder ball 108.

The solder ball 108 is formed with, for instance, lead-free solder; and the solder ball 108 is formed so as to cover the alloy layer 110.

Figure 18:
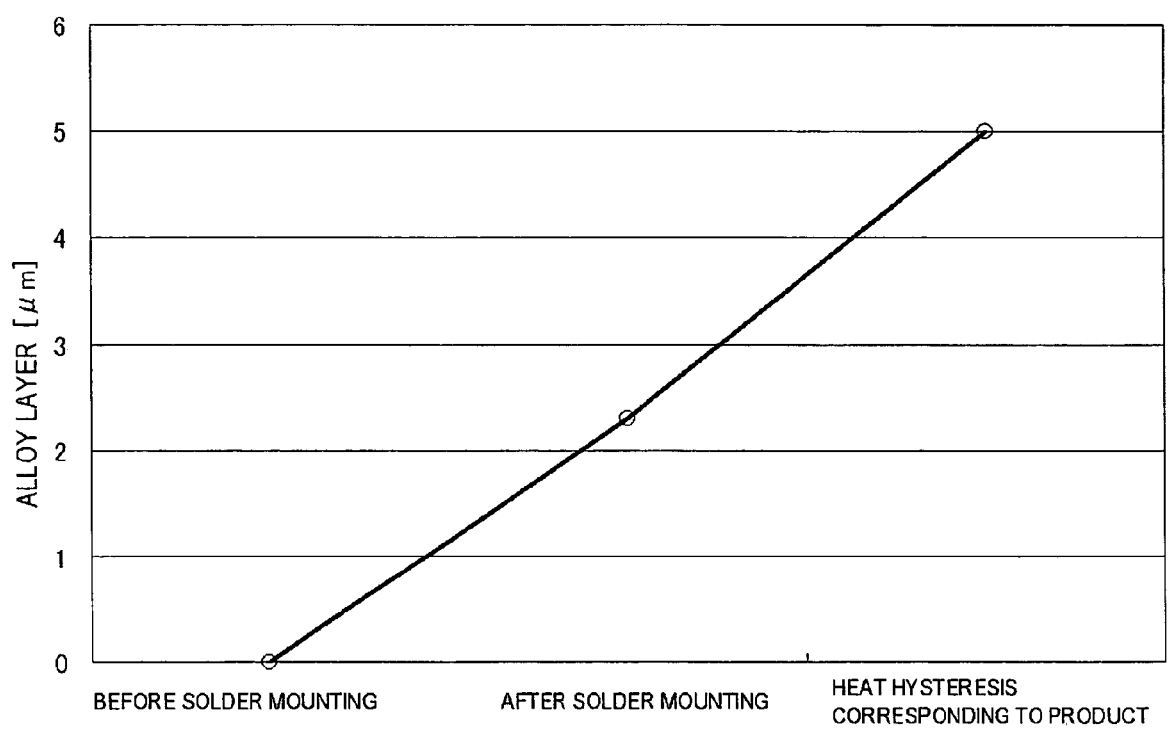
FIG. 18 is a diagram explaining with respect to the formation of the alloy layer.

The present inventor have made sure with the experiment that the alloy layer 110 is formed on the interface between the solder ball 108 and the UBM film 107, and on the interface between the solder ball 108 and the Cu film 111. FIG. 18 is a graph in which, in the above structure, formation of the alloy layer is ascertained. The formation of the alloy layer has been ascertained with SEM (scanning electron microscope).

As shown in FIG. 18, the alloy layer is not detected before mounting solder. On the contrary, after mounting solder (after reflow processing), the alloy layer with approximately 2.3 µm is observed, further, in the observation in consideration of a heat hysteresis corresponding to a state after mounting processing according to flip chip form, the alloy layer of 5 μm is ascertained.

Figure 8:
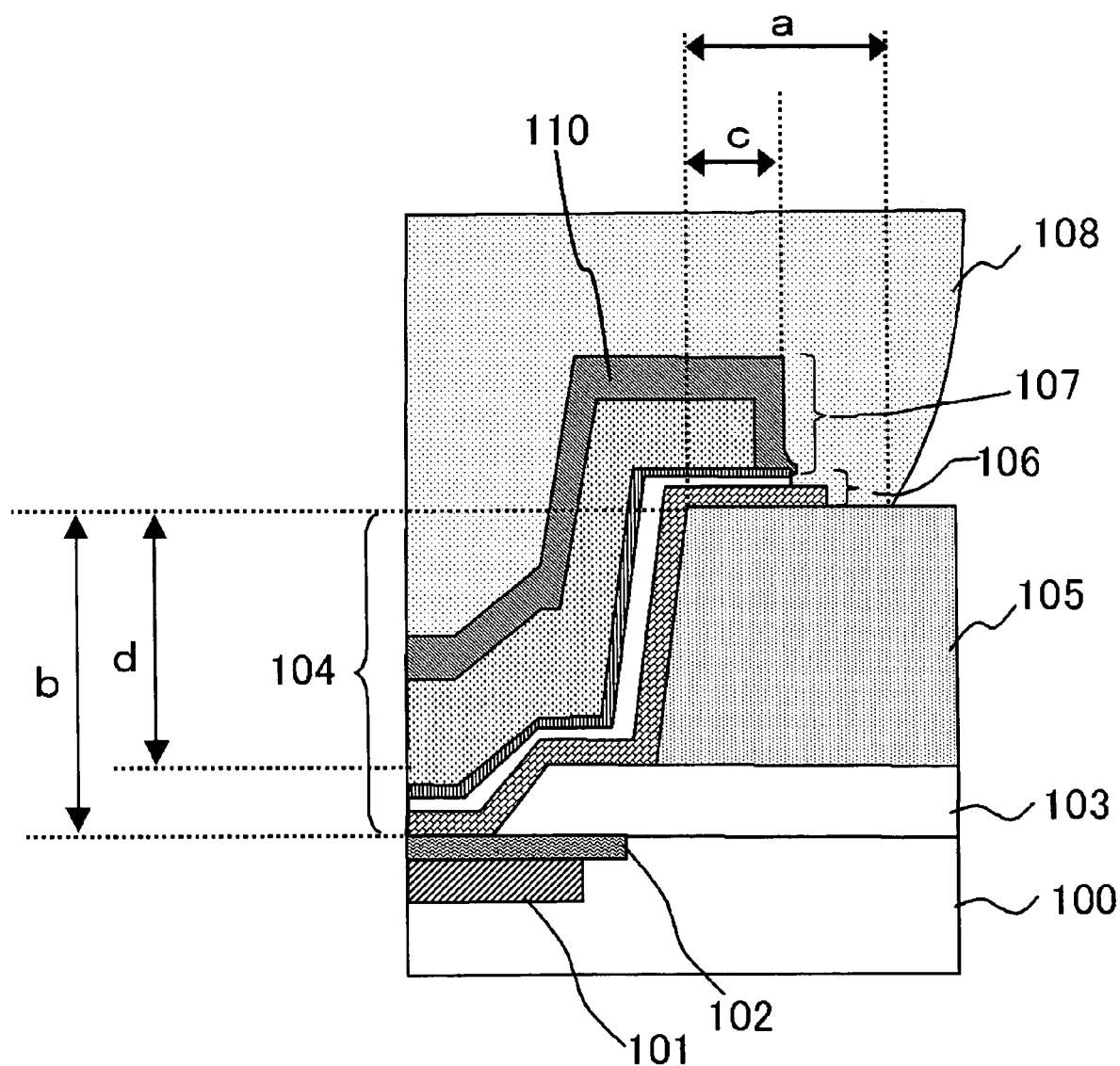
FIG. 8 is a sectional diagram showing structure of the semiconductor device according to the embodiment.

FIG. 8 is a diagram showing an enlarged part near the terminal of the solder ball 108.

There will be described a shape factor of the bump structure shown in FIG. 8. The signs "a" to "d" in the drawings indicate following dimensions.

a: distance between the terminal of the solder ball 108 in the face coming into contact with the insulating resin layer 105 and the upper periphery of the via 104;
b: depth of the via 104 (a distance from the upper face of the cap layer 102 to the upper face of the insulating resin layer 105);
c: distance between the terminal of the UBM film 107 and the upper periphery of the via 104;
d: thickness of the insulating resin layer 105;

The bump structure according to the present embodiment fulfills following relationship.

$$0 < a/b \leq 2$$

$$0 < c/b \leq 1.3$$

The sign "d" indicates approximately 7 μm.

The bump structure according to the present embodiment fulfills the relationship described above. Therefore, the adhesion between the solder ball 108 and the UBM film 107 is improved, and the pad, which is composed of the UBM film 107, the Cu film 111 and the barrier metal film 106, is improved on its reliability. This reason is not necessarily apparent, however, it is conceivable that the insulating resin layer 105 sufficiently functions as the buffer layer upon fulfilling the above relationship.

In addition, in the structure where the alloy layer 110 is formed, like the present embodiment, propagation of the crack in the alloy layer 110 is suppressed upon fulfilling the above relationship, also from this point, it is conceivable that the adhesion is improved.

According to the study of the present inventor, the interfacial breakdown occurs depending on the following mechanism. That is, in the solder ball connected between the substrate and the chip, the residual thermal stress occurs in the solder ball caused by difference of the thermal expansion coefficient between the substrate and the chip. When this residual thermal stress exceeds tolerance, the breakdown portion occurs in alloy layer 110, followed by crack propagating into the alloy layer 110 with this place as a point of origin, resulting in the interfacial breakdown. Thus, the interfacial breakdown generally occurs by the fact that the crack is generated in the alloy layer 110 caused by the thermal stress.

Here, in the structure fulfilling the above relationship, it is conceivable that the shape of the alloy layer 110 becomes a suitable shape to inhibit progress of the crack occurring between the solder ball 108 and the UBM film 107. That is, when fulfilling the above relationship, the alloy layer 110 is formed with the form of largely bending in the depth direction along the shape of the via 104. Thereby, in the bending point in the vicinity of a part near the upper periphery of the via 104, progress of the crack from the terminal side of the UBM film 107 is inhibited; therefore, it is conceivable that the adhesion is improved.

Figure 9:
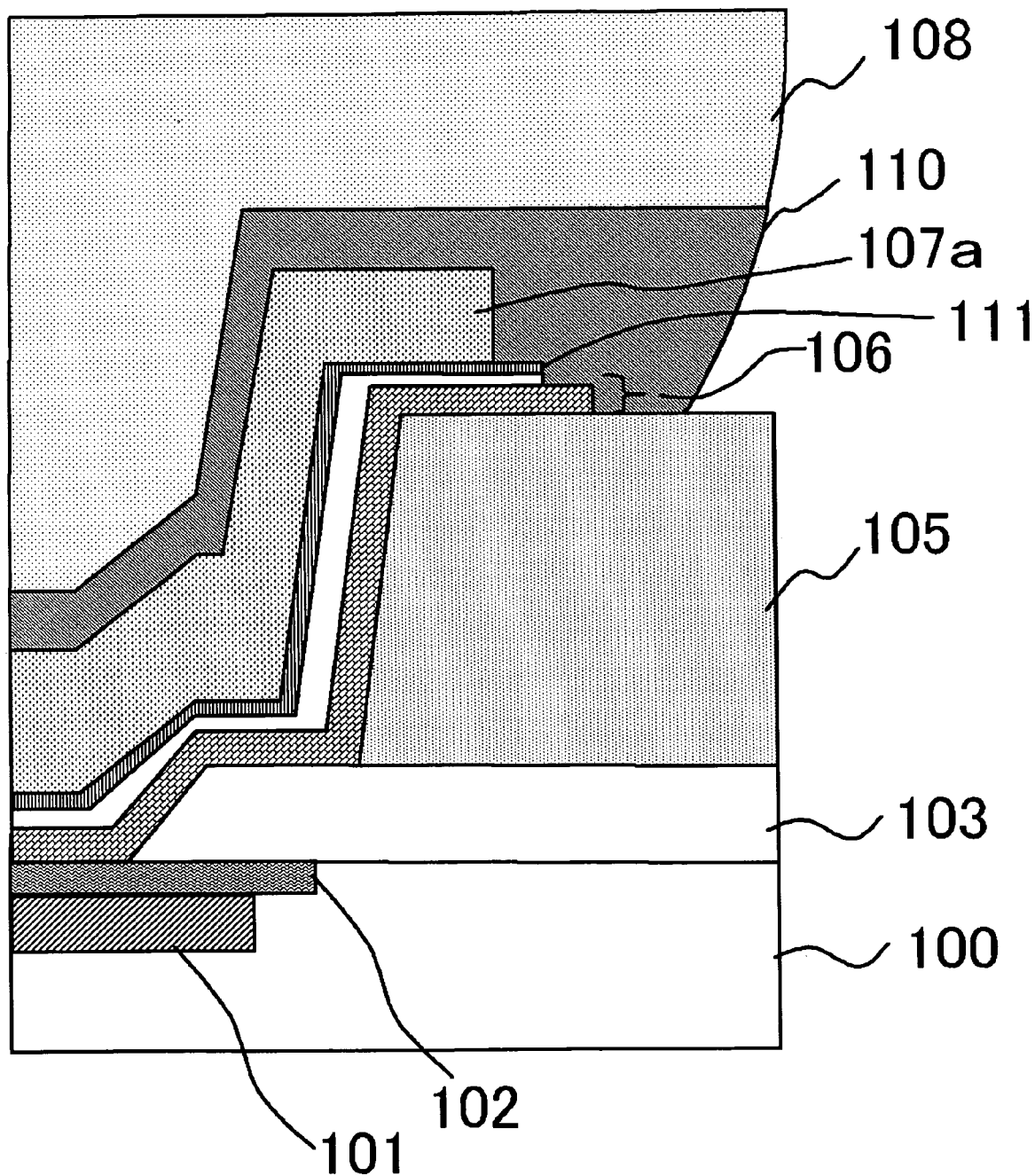
FIG. 9 is a diagram showing a part near a terminal of a solder ball of a semiconductor device in which an alloy layer is exposed outside the semiconductor device.

It should be noted that the bump structure shown in FIG. 8 adopts structure where the alloy layer 110 is covered with the solder ball 108. In the formation process of the solder ball 108, even though the alloy layer 110 grows to be formed, it results in the state where the alloy layer 110 is not exposed to the exterior. That is, differently from the structure as shown in FIG. 9, the structure where the alloy layer 110 is not exposed to the exterior than the solder ball 108 is adopted. Thereby, it is possible to prevent the solder crack from occurring. That is, residual thermal stress occurs in the solder ball caused by difference of thermal expansion coefficient between a substrate and a chip in the solder ball connected between the substrate and the chip. When the residual thermal stress exceeds tolerance, the breakdown portion occurs on alloy layer 110, followed by crack propagating into the alloy layer 110 with this place as a point of origin, resulting in the interfacial breakdown. When adopting structure in which the solder ball 108 covers the alloy layer 110, it is possible to effectively suppress the interfacial breakdown caused by such mechanism.

Hereinafter, there will be described one example of the manufacturing process of bump structure shown in FIG. 1.

Figure 2:
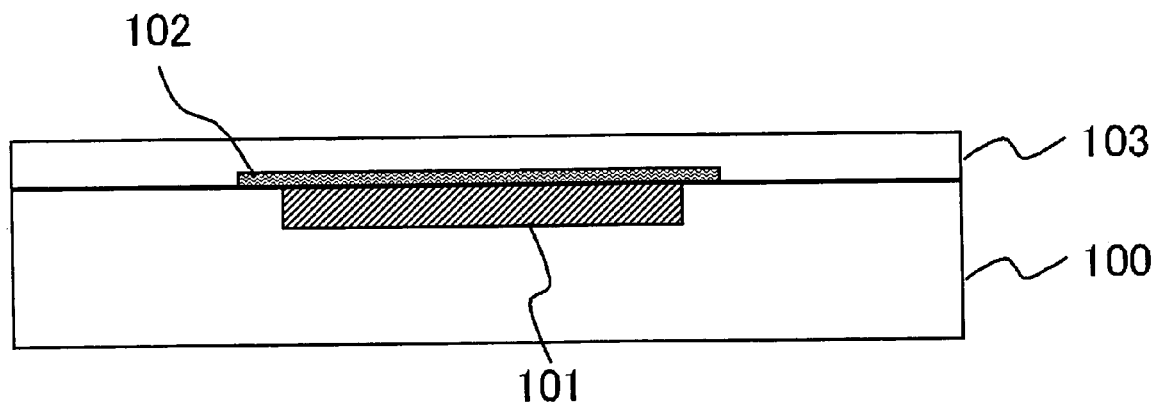
FIG. 2 is a process sectional diagram showing one example of a manufacturing process of the semiconductor device according to the embodiment.

Initially, structure shown in FIG. 2 is manufactured. Firstly, elements are formed above a silicon substrate (not shown in the drawing); after that multilayered copper interconnection is formed above the silicon substrate while using a damascene process. FIG. 2 shows an uppermost part of the multilayered copper interconnection. An uppermost layer interconnection 101 is embedded in the insulating film 100. A film composed of TiN or SiCN on an upper face of the insulating film 100 and the uppermost layer interconnection 101 is formed. Subsequently, a cap layer 102 is formed above the uppermost layer interconnection 101 while performing etching selectively. It should be noted that, when using SiCN to be the insulating film as a material of the cap layer 102, there is provided a contact hole to the uppermost layer interconnection 101. Next, the passivation film 103 is formed by chemical vapor deposition method (CVD method). The film thickness of the passivation film 103 takes a preferable value with film thickness about 0.3 to 1 μm. However, in the present embodiment, the film thickness of the passivation film 103 is set to 0.5 μm. Thereby, there is obtained structure of FIG. 2.

Figure 3:
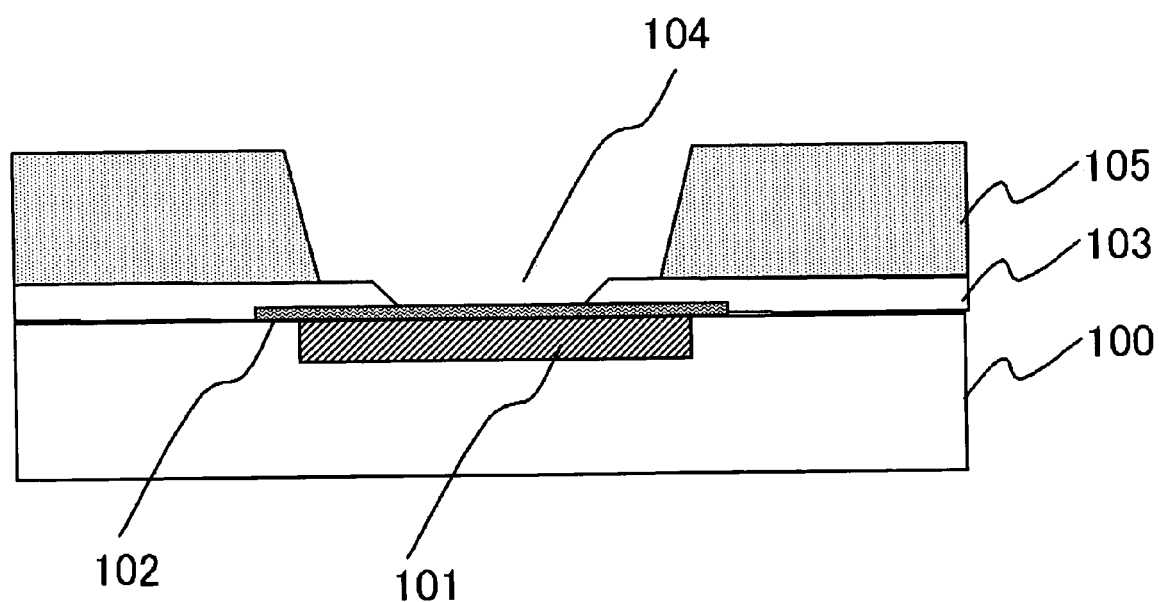
FIG. 3 is a process sectional diagram showing one example of the manufacturing process of the semiconductor device according to the embodiment.

Next, there is provided an opening on the cap layer 102 while performing dry etching the passivation film 103 selectively. Thereafter, an insulating resin layer 105 on the whole surface of the cap layer 102 and the passivation film 103 is formed. As for the material of the insulating resin layer 105, it is possible to use polyimide, polybenzoxazole or the like to be a photosensitive material. The film thickness of the insulating resin layer 105 is preferably set to, for instance, 1 to 10 μm. In the present embodiment, it is set to 7 μm. Successively, the pad via 104 at which the cap layer 102 is exposed to the bottom is formed while performing exposure using mask, which is not shown in the drawing (FIG. 3). Depth of the via 104 is 7.5 μm. After providing the opening, there is performed baking during 20 to 30 minutes at the temperature of degree of 350° C.

Figure 4:
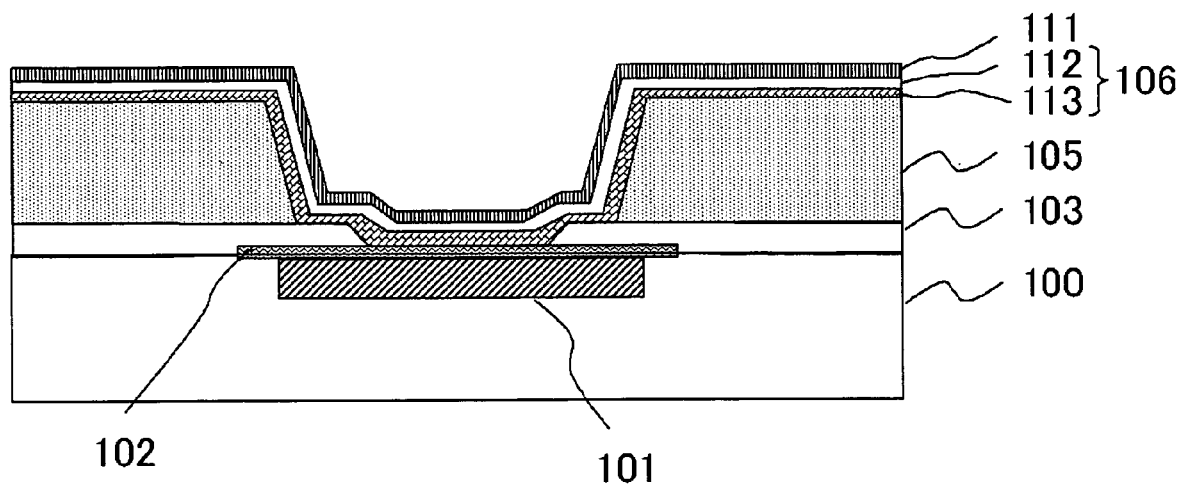
FIG. 4 is a process sectional diagram showing one example of the manufacturing process of the semiconductor device according to the embodiment.

A barrier metal film 106 is obtained while forming TiW film 113, and Ti film 112 on structure provided with the via 104 shown in FIG. 3 by a sputtering method (FIG. 4). Each film thickness is capable of being set to, for instance, following values.

TiW film 113: 100 to 500 nm
Ti film 112: 10 to 200 nm

In the present embodiment, TiW film 113 is set to 200 nm, Ti film 112 is set to 30 nm.

After that, the Cu film 111 is formed above the barrier metal film 106. The film thickness of the Cu film 111 is capable of being set to 100 to 500 nm. Here, it is set to 300 nm. After that, a resist film, which is subjected to a patterning, is formed on the Cu film 111. Then, Ni film 115 (film thickness 3 μm) and Cu film 114 (film thickness 400 nm) are made to grow using the plating method. Next, the UBM film 107 (FIG. 5) is obtained upon stripping the resist film.

Figure 6:
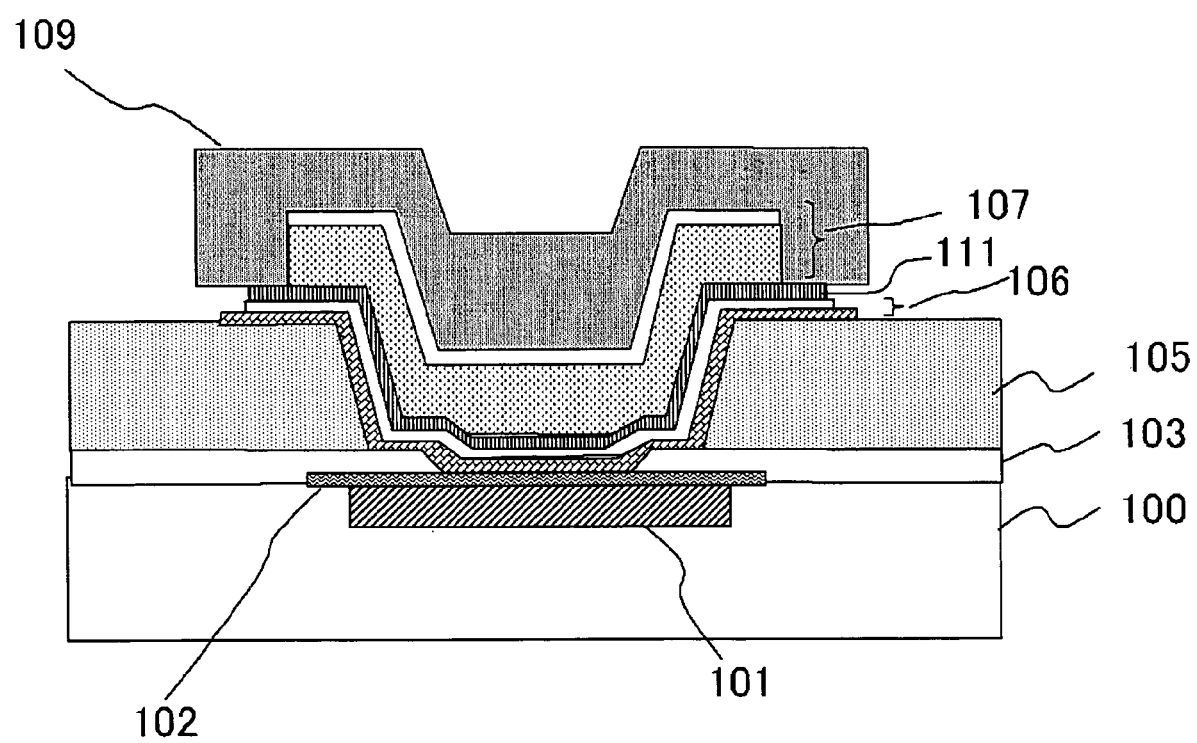
FIG. 6 is a process sectional diagram showing one example of the manufacturing process of the semiconductor device according to the embodiment.

Successively, a resist 109 is formed so as to cover the UBM film 107. After that, with the resist 109 as a mask, Cu film 111 and the barrier metal film 106 are etching-stripped selectively. With respect to the etching, it is possible to use a wet etching. It may be also possible to use a dry etching. FIG. 6 is a process sectional diagram showing the state after etching. Each film constituting the Cu film 111 and the barrier metal film 106 has an etching speed to an etchant that is different from each other; therefore, as shown in the drawing, a step is formed at an end face.

Figure 7:
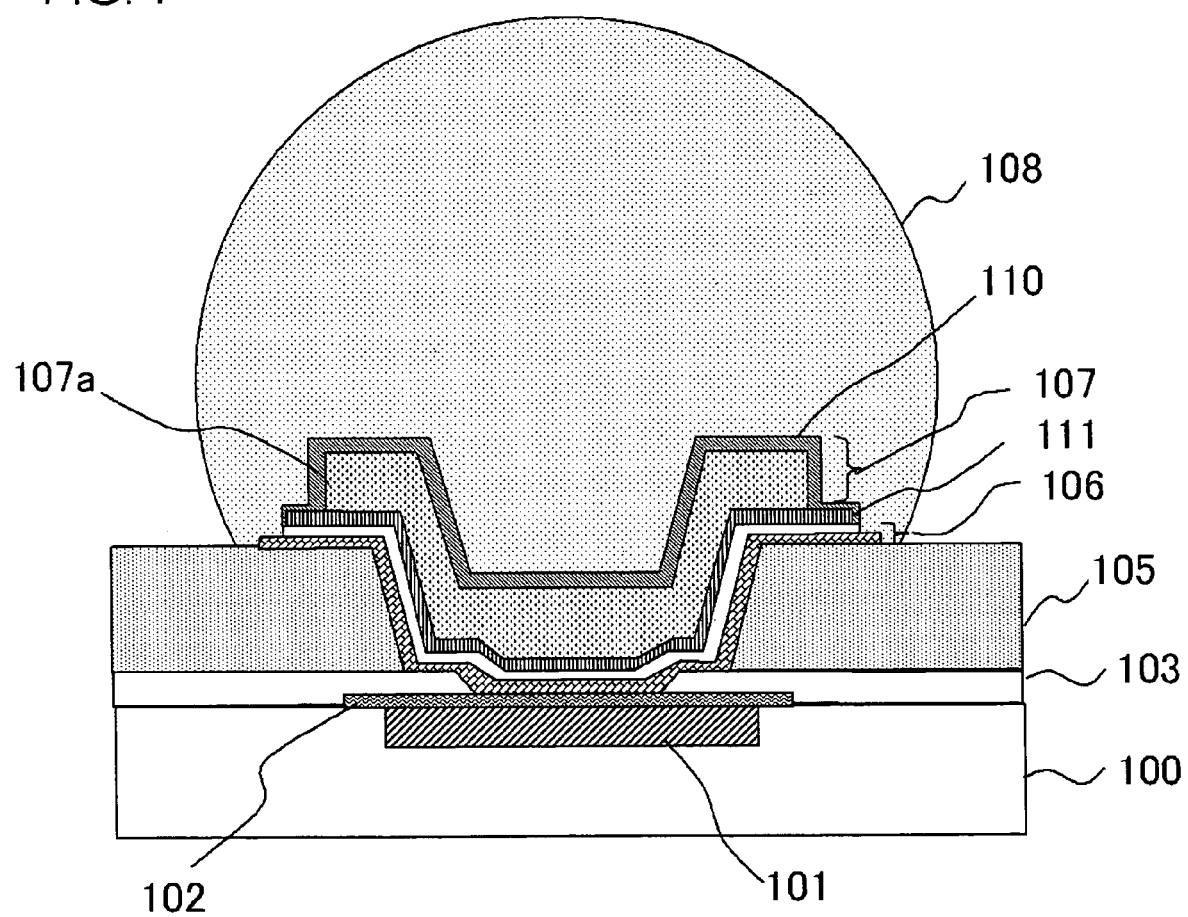
FIG. 7 is a process sectional diagram showing one example of the manufacturing process of the semiconductor device according to the embodiment.

After that, after stripping a resist 109, the solder ball 108 is formed while coming into contact with an upper face of the UBM film 107 (FIG. 7). It is possible to use various kinds of materials for the solder ball 108. Now, in the present embodiment, the solder ball 108 is constituted of the lead-free solder containing Sn, Ag and Cu. Firstly, a solder printing mask having an opening with a pad part comprising the barrier metal film 106, Cu film 111 and the UBM film 107 exposed is provided. Then, the solder material is printed by a screen printing method. After stripping the mask, a spherical solder ball 108 is formed upon performing the reflow, for instance, at 220° C. to 265° C. At this reflow process, the alloy layer 110 is formed in such a way that the metallic element contained in the solder ball 108, the metallic element contained in the Cu film 111 and the metallic element contained in the UBM film 107 are diffused mutually at the interface between the UBM film 107 and the solder ball 108 and at the interface between the solder ball 108 and the Cu film 111. In the present embodiment, the alloy layer 110 containing Sn of the solder ball 108, Cu and Ni of the UBM film 107 and Cu of the Cu film is formed. As shown in the drawing, this alloy layer 110 is formed across from an upper face of the UBM film 107 along a side face 107a, and across from an upper face of the Cu film 111 to a side face thereof.

On the basis of the above processes, the bump structure provided with the solder ball 108 is formed. In the above manufacturing process, there is materialized the structure fulfilling 0<a/b≦2, 0<c/b≦1.3, in FIG. 8, by making the thickness of the insulating resin layer 105 thicker than usual case.

In addition, as shown in FIG. 7, the solder ball 108 is formed so as to cover the whole pad including the UBM film 107. According to this, the barrier metal film 106, the Cu film 111 and an end face of the UBM film 107 are coated with the solder ball 108. At the above described process, such structure is realized by setting an opening of a solder printing mask wider than the pad.

Hereinafter, there will be described a modified example of the manufacturing method of the above bump structure.

Figure 5:
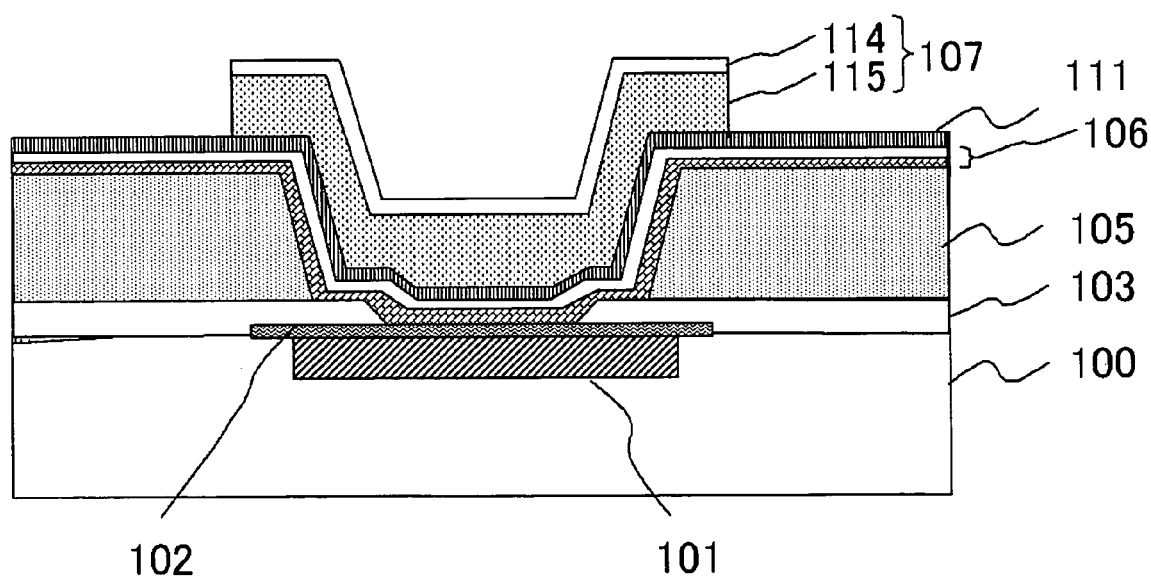
FIG. 5 is a process sectional diagram showing one example of the manufacturing process of the semiconductor device according to the embodiment.
Figure 10:
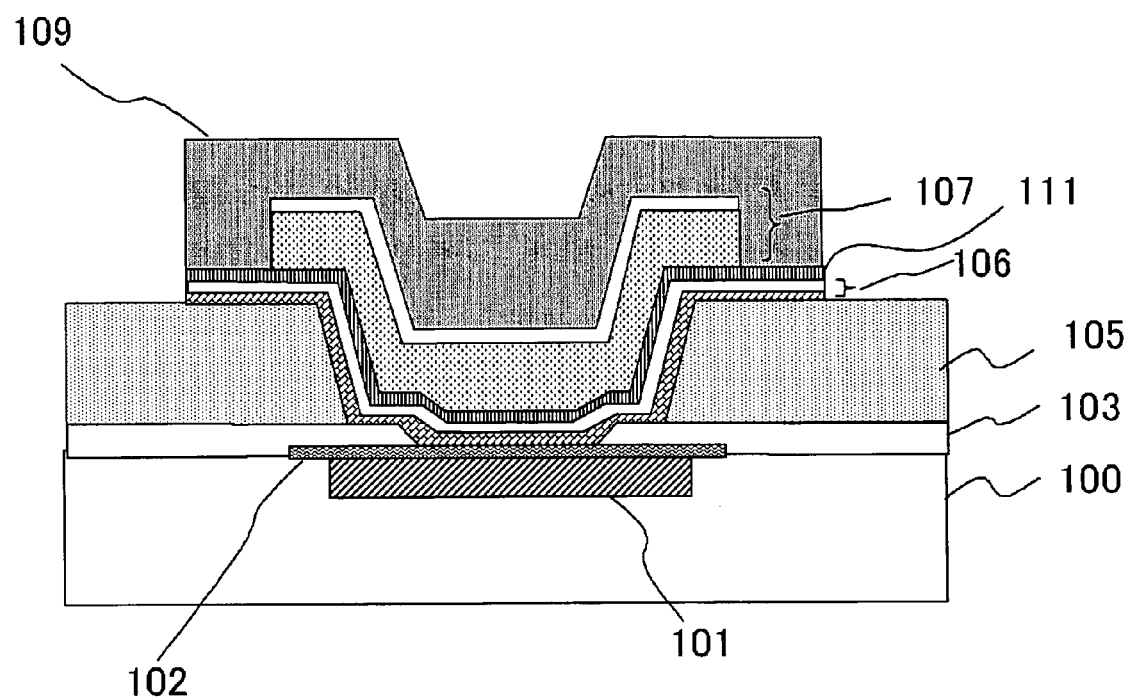
FIG. 10 is a process sectional diagram showing one example of the manufacturing process of the semiconductor device according to the embodiment.

In the above described process, after the step shown in FIG. 5, the resist 109 is formed so as to cover the UBM film 107. Thereafter, with the resist 109 as the mask, the Cu film 111 and the barrier metal film 106 are stripped selectively by etching. At this time, the wet etching is used to strip the Cu film 111 and the barrier metal film 106. However, also the dry etching may be used to strip the Ti film 112 and the TiW film 113 after wet etching of the Cu film 111. FIG. 10 is a process sectional diagram showing a state after the etching. As shown in FIG. 10, after the dry etching, end faces of respective films constituting the Cu film 111 and the barrier metal film 106 are arranged along the end face of the resist 109.

Figure 11:
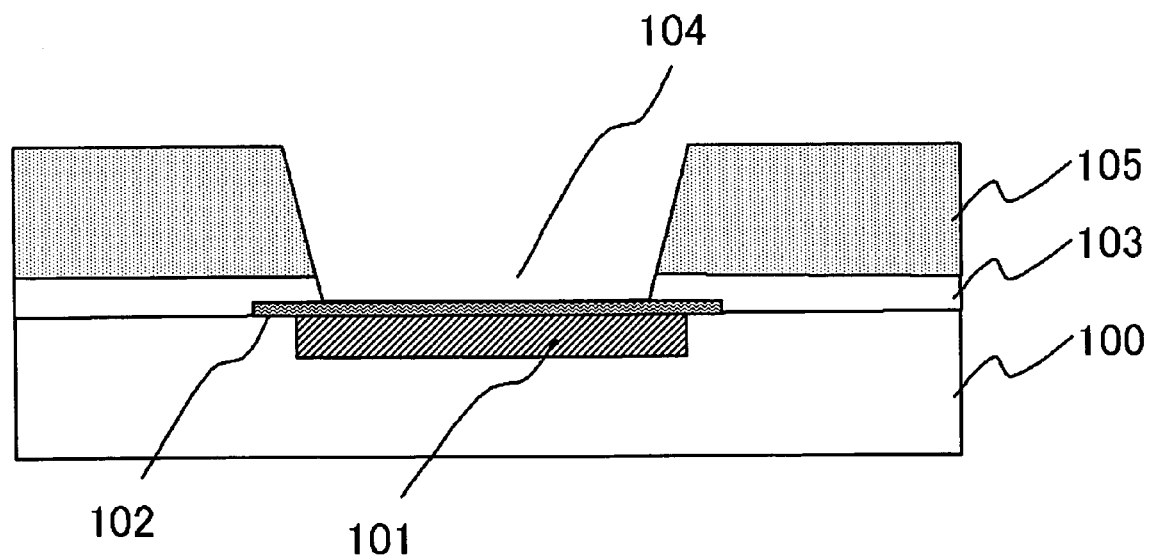
FIG. 11 is a process sectional diagram showing one example of the manufacturing process of the semiconductor device according to the embodiment.
Figure 12:
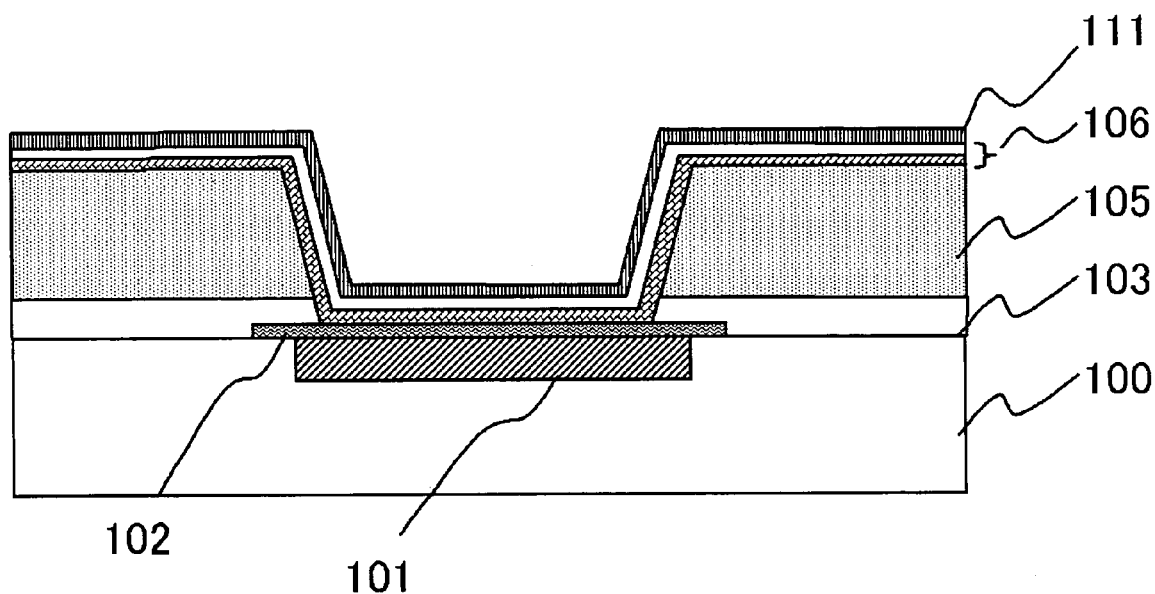
FIG. 12 is a process sectional diagram showing one example of the manufacturing process of the semiconductor device according to the embodiment.

In addition, in the above embodiment, in the process shown in FIG. 3, the opening is provided on the passivation film 103. Thereafter, the insulating resin layer 105 is formed. Next, there is adopted a process to open the insulating resin layer 105 larger than the opening to provide a step inside the via 104. The via 104 is also capable of being formed in such a way as another process. For instance, as shown in FIG. 11, the passivation film 103 is formed, followed by applying a coating liquid including insulating resin, subsequently, exposure is performed using the mask not shown in the drawing to form the insulating resin layer 105 with an opening. Next, after forming the opening, the via 104 may be formed while performing dry etching the passivation film 103 with the insulating resin layer 105 as the mask. After that, as shown in FIG. 12, it is possible to form the barrier metal film 106 in such a way that the TiW film 113 and the Ti film 112 are formed successively. In such a way as above, it is possible to realize the state where the step is not formed inside the via 104.

(Second Embodiment)

The present embodiment shows an example forming a bump structure depending on a different process from the first embodiment.

Figure 13:
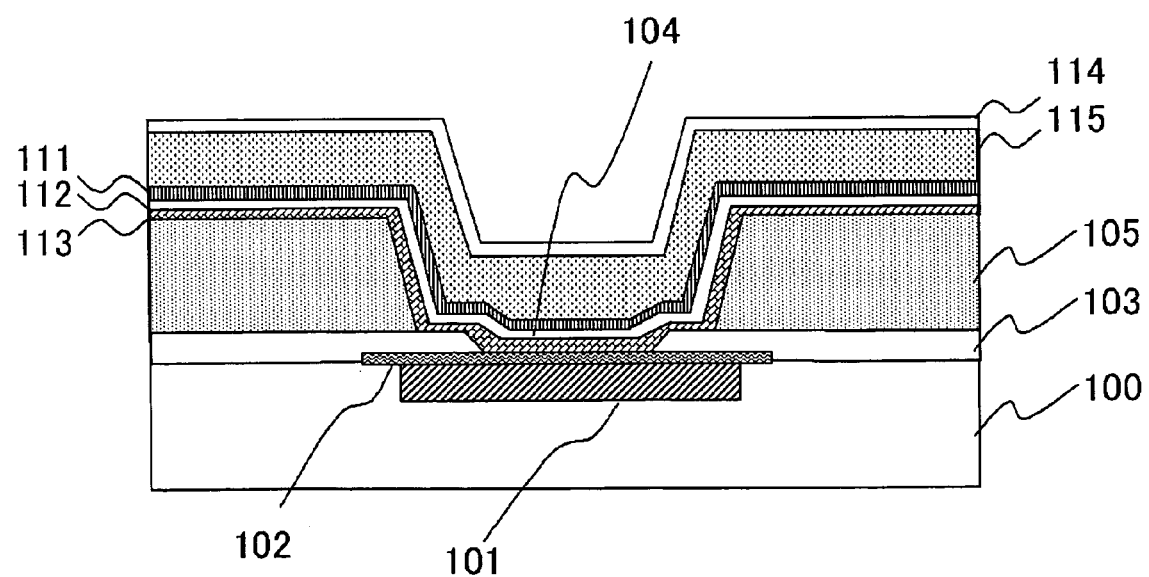
FIG. 13 is a process sectional diagram showing one example of the manufacturing process of the semiconductor device according to the embodiment.

The TiW film 113, the Ti film 112 and the Cu film 111 are formed sequentially by performing processes until FIG. 4 from FIG. 2 described above, in addition, the Ni film 115 and the Cu film 114 are formed sequentially above the Cu film 111 using the plating method (FIG. 13). Respective film thicknesses may be set to, for instance, the following values.

TiW film 113: 100 to 500 nm
Ti film 112: 10 to 200 nm
Cu film 111: 100 to 500 nm
Ni film 115: 2 to 5 μm
Cu film 114: 200 to 500 nm It should be noted that, in the present embodiment, the film thickness of the TiW film 113 is set to 200 nm, film thickness of the Ti film 112 is set to 30 nm, the film thickness of the Cu film 111 is set to 300 nm, the film thickness of the Ni film 115 is set to 3 μm and the film thickness of the Cu film 114 is set to 400 nm.

Figure 14:
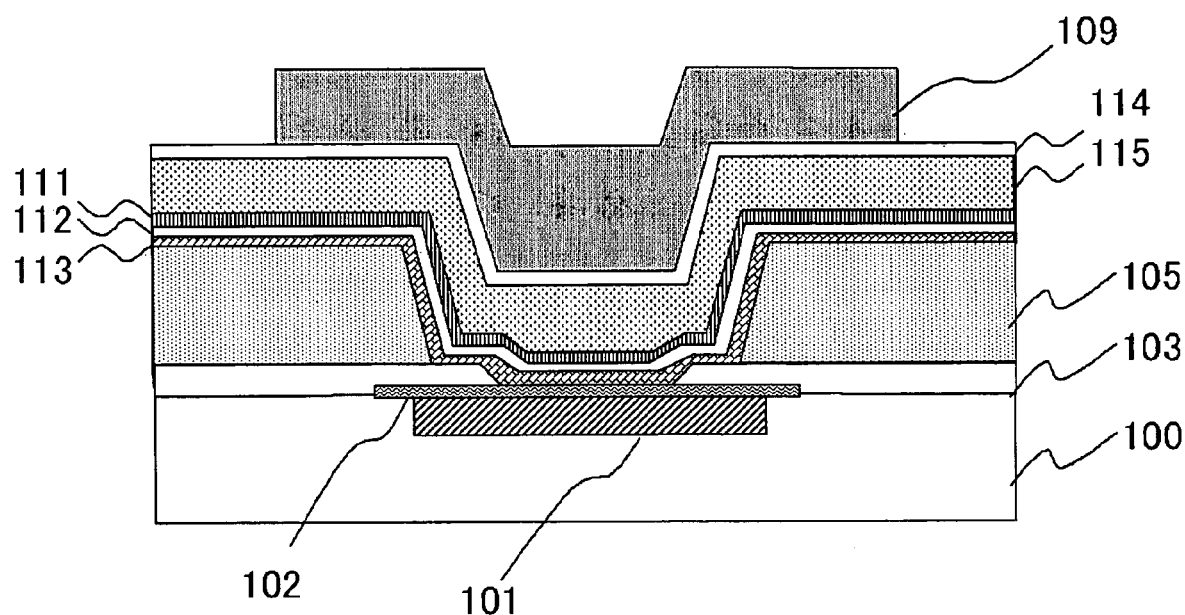
FIG. 14 is a process sectional diagram showing one example of the manufacturing process of the semiconductor device according to the embodiment.
Figure 15:
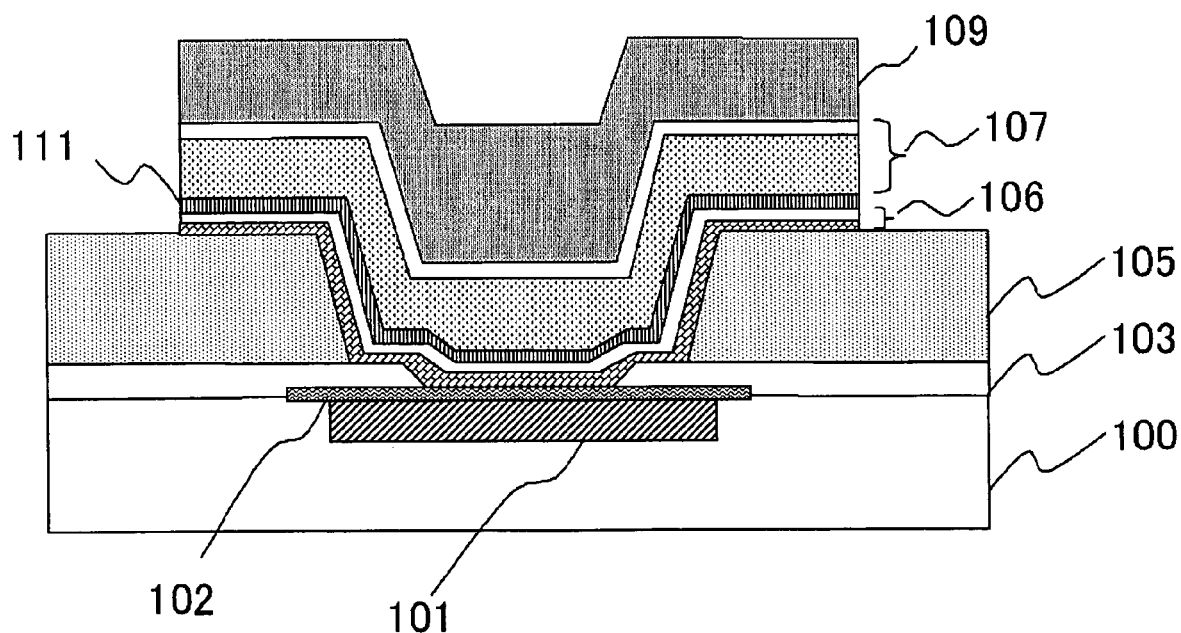
FIG. 15 is a process sectional diagram showing one example of the manufacturing process of the semiconductor device according to the embodiment.

Successively, the resist 109, which is subjected to the patterning so as to cover a part to become the UBM film 107 above the Cu film 114, is formed (FIG. 14). Then, with the resist 109 as the mask, the Cu film 114, the Ni film 115, the Cu film 111, the Ti film 112 and TiW film 113 are selectively stripped by etching to form the barrier metal film 106, the Cu film 111 and the UBM film 107 (FIG. 15).

Figure 16:
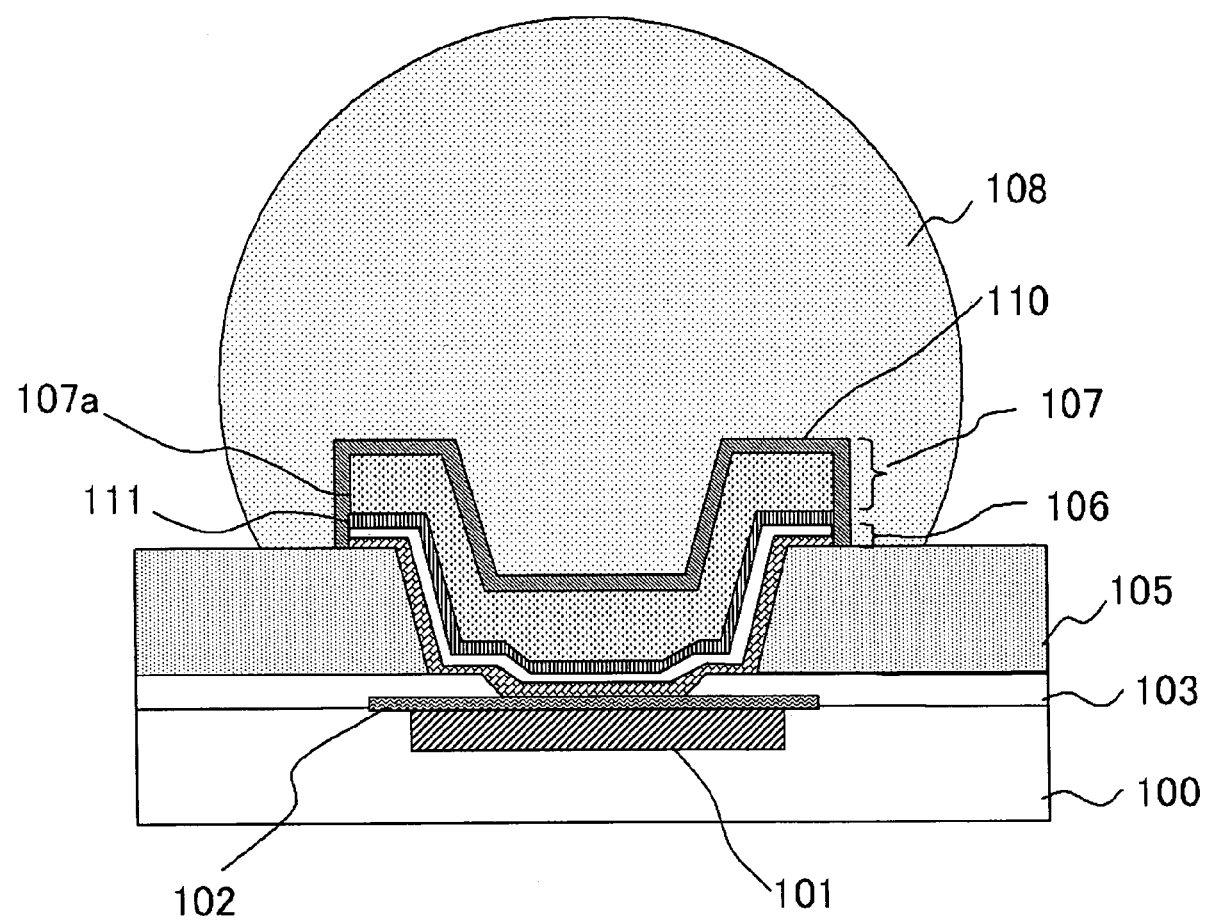
FIG. 16 is a process sectional diagram showing one example of the manufacturing process of the semiconductor device according to the embodiment.

Further, as described above, after stripping the resist 109, the solder ball 108 is formed in such a way as to come into contact with an upper face of the UBM film 107 (FIG. 16). As for the materials used for the solder ball 108, the formation conditions of the solder ball 108 and the like, matters described above are indicated. In this case, the alloy layer 110 is formed in such away that the metallic elements contained in the solder ball 108, Cu and Ni result from the Cu film 114 and the Ni film 115 and Cu result from the Cu film 111 are mutually diffused at the interface between the UBM film 107 and the solder ball 108, and at the interface between the Cu film 111 and the solder ball 108 in the reflow process. In the present embodiment, the alloy layer containing Sn of the solder ball 108 and Cu, Ni result from the UBM film 107 is formed. As shown in the drawing, this alloy layer 110 is formed across from the upper face of the UBM film 107 along the side face 107a, further, formed across the side face of the Cu film 111 and the barrier metal film 106.

As above, there is described the embodiment of the present invention while referring to the drawings, however, these are exemplifications of the present invention, consequently, it is possible to adopt various constitutions in addition to the above.

For instance, it may be suitable that a film corresponding to the Ni film 115 constituting the UBM film 107 is changed into nickel vanadium alloy (Ni—V) instead of Ni as the material. In this case, such nickel vanadium alloy (Ni—V) film is capable of being formed with the sputtering method with film thickness of degree of 3000 to 4000 angstroms (300 to 400 nm).

Figure 21:
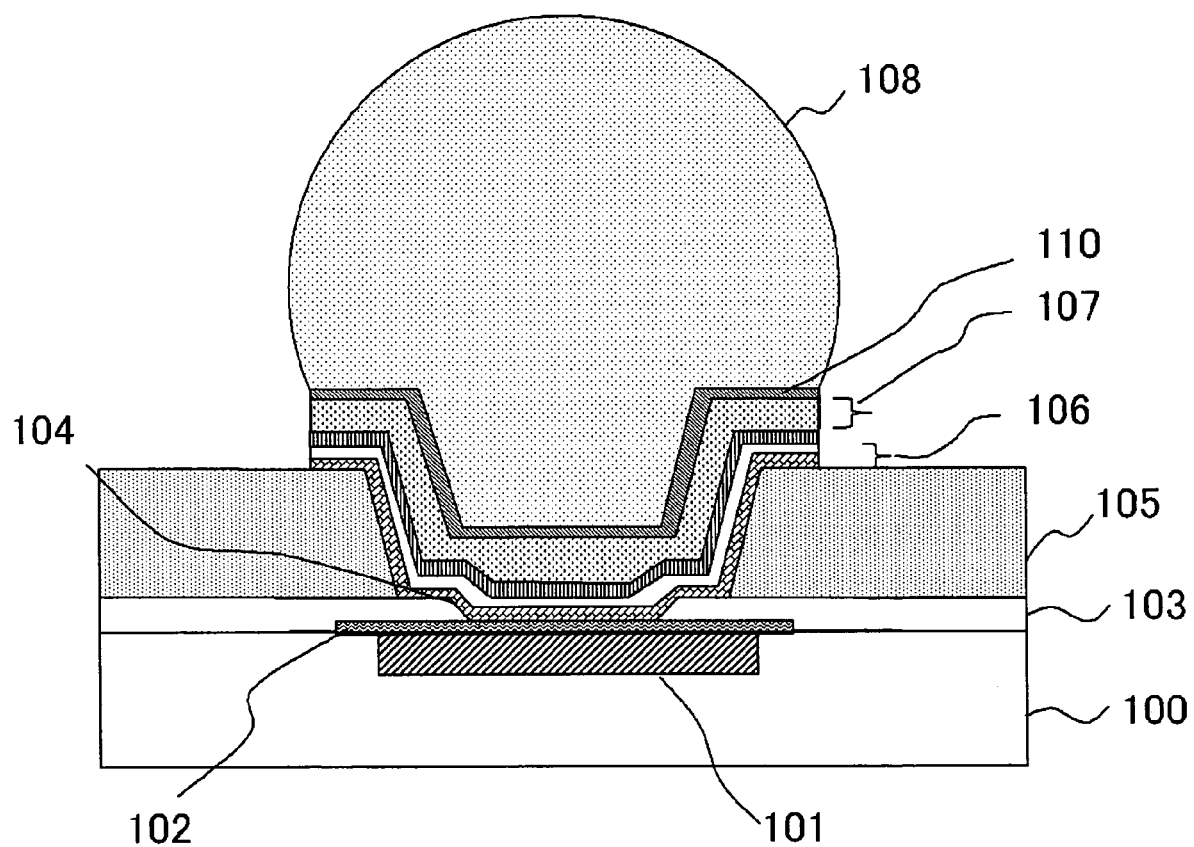
FIG. 21 is a sectional diagram showing structure of the semiconductor device according to the embodiment.

In addition, in the above embodiment, although the constitution where the solder ball 108 covers the alloy layer 110 is adopted, as shown in FIG. 21, constitution where the alloy layer 110 is not covered with the solder ball 108, but the alloy layer 110 is exposed to the exterior may be adopted.

EMBODIMENT EXAMPLE 1

Hereinafter, there will be described the present invention using an embodiment example. It should go without saying that the present invention is not limited to the embodiment example.

Figure 17:
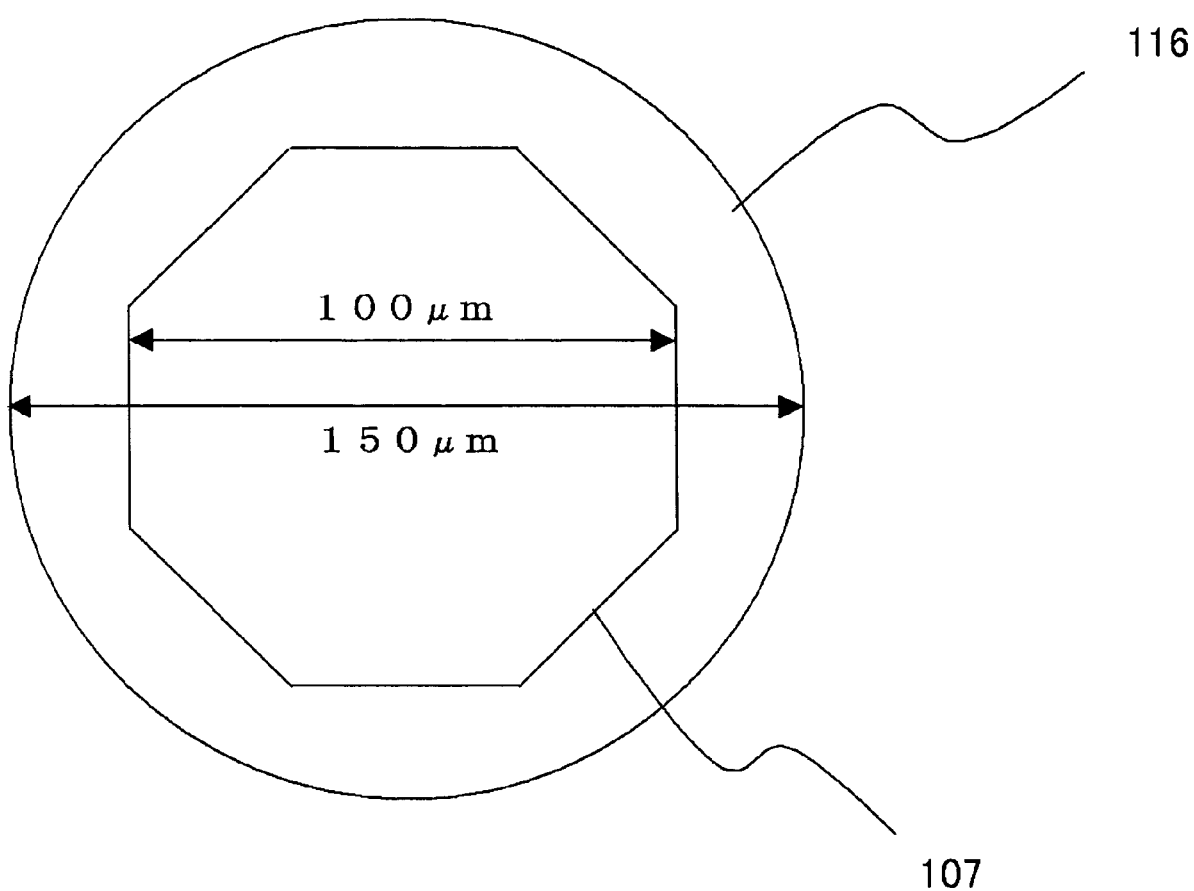
FIG. 17 is a diagram showing a shape of an UBM and a solder printing mask used in an example.

In the present embodiment example, the semiconductor device has been formed based on the process described in the first embodiment. Here, in the formation process of the solder ball described while referring to FIG. 7, the mask shown in FIG. 17 is used. FIG. 17 is a diagram in which the UBM film 107 and the opening 116 of the solder printing mask are seen from the upper face. As shown in the drawing, the UBM film 107 has an octagonal shape seen from the upper face. Distance between opposed sides is 100 μm. Diameter of the opening 116 of the solder printing mask with approximately circular shape is set to 150 μm.

The solder ball 108 is formed via the reflow process after printing the solder material according to the screen printing method using this mask. The formation condition of the solder ball 108 is just as following one.

Solder material: lead-free solder containing Sn, Ag and Cu;

Reflow condition: peak temperature 260° C., and Peak temperature sustaining time 1 minute; the time period from the state where the solder material is introduced into a furnace to the state where the solder material is drawn out from the furnace is 15-minutes;

It should be noted that the peak temperature is appropriately selected from temperature of 220 to 260° C., and the time period from the state where the solder material is introduced into the furnace to the state where the solder material is drawn out from the furnace is appropriately selected from range of 10 to 15 minutes.

As described above, the bump structure for flip chip shown in FIG. 7 is formed.

Figure 19:
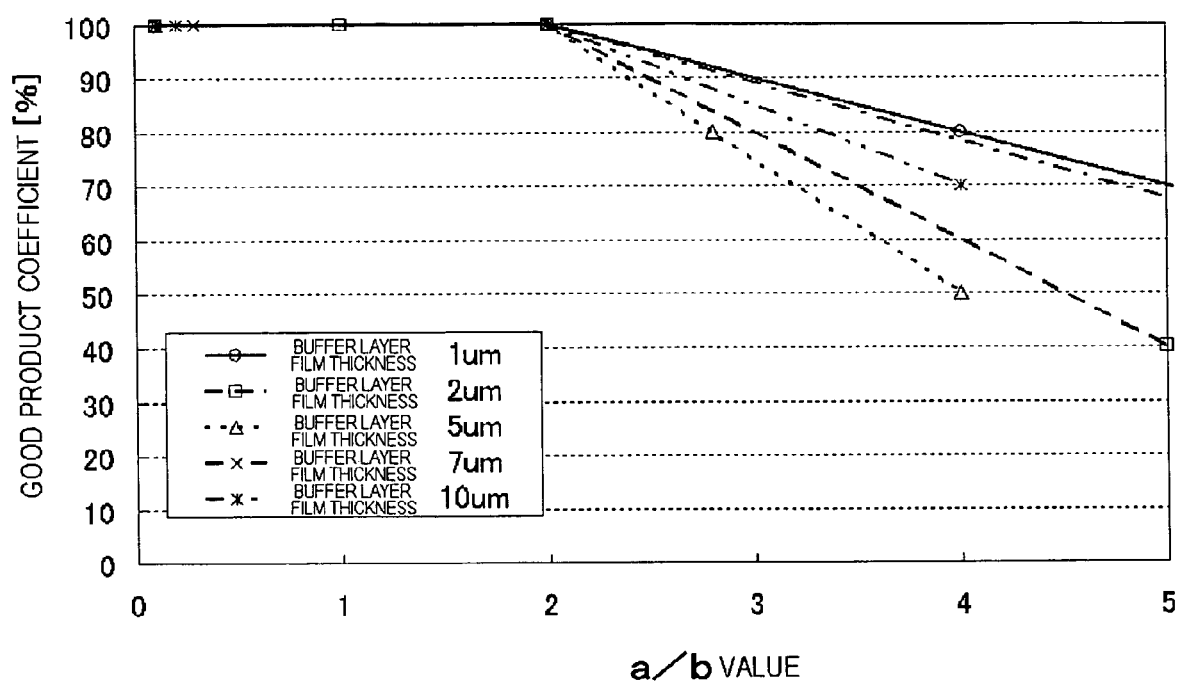
FIG. 19 is a graph representing a result of a heat cycle test.
Figure 20:
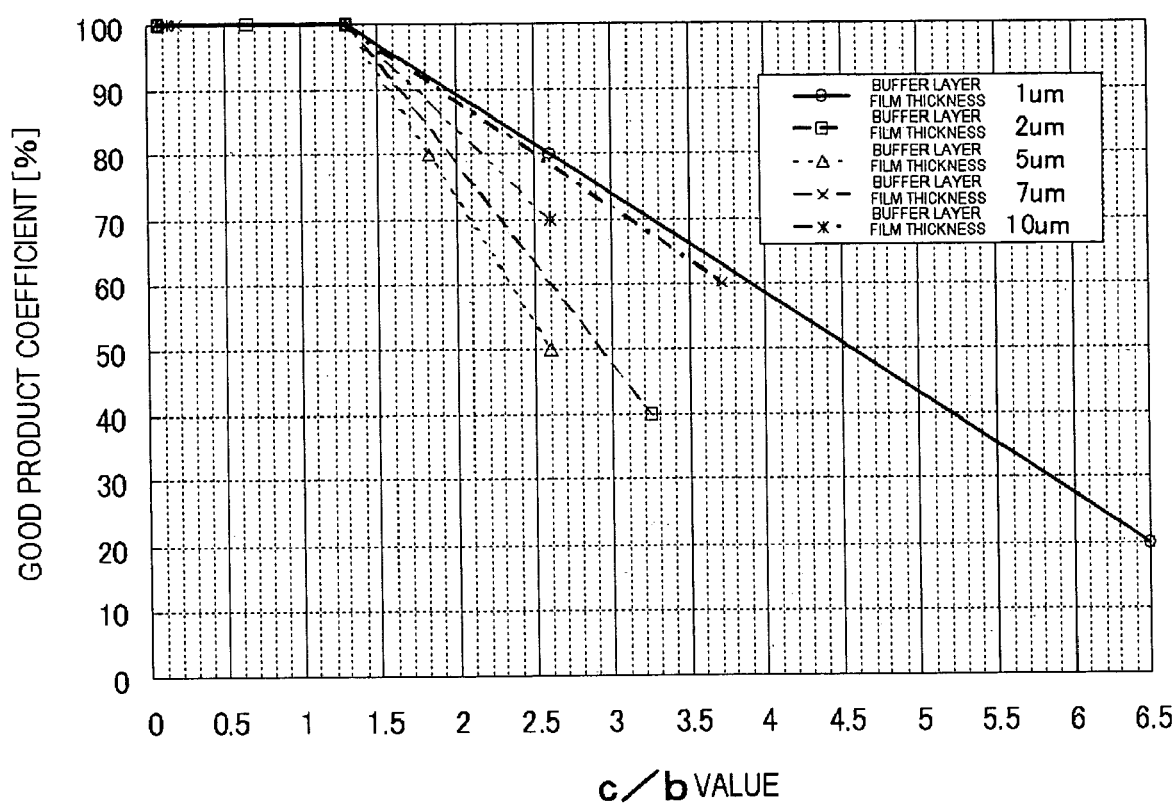
FIG. 20 is a graph representing a result of a heat cycle test.

FIG. 8 is a diagram showing the enlarged part near the terminal of the solder ball 108 manufactured. The signs "a" to "d" in the drawings indicate following dimensions.

a: distance between the terminal of the solder ball 108 in the face coming into contact with the insulating resin layer 105 and the upper periphery of the via 104;
b: depth of the via 104 (a distance from the upper face of the cap layer 102 to the upper face of the insulating resin layer 105);
c: distance between the terminal of the UBM film 107 and the upper periphery of the via 104;
d: thickness of the insulating resin layer 105;

In the present embodiment example, value of "d" is set to 1, 2, 5, 7 and 10 μm respectively. The bump structure is manufactured while changing value of a/b, and c/b. Heat cycle test at −55° C. to +125° C. is performed to each bump structure to obtain a good product coefficient. In the heat cycle test, the bump structure with no rupture on the electrical characteristics after 1000 cycles is defined as the good product. The defective product is one with result of "open condition" caused by the solder crack. The results are shown in FIGS. 19 and 20. From the result shown in the drawing, when fulfilling 0<a/b≦2, 0<c/b≦1.3, it has been clear that good result is obtained.

It is apparent that the present invention is not limited to the above embodiment that modified and changed without departing from the scope and sprit of the invention.

What is claimed is:

1. A semiconductor device comprising:
an interconnection;
an insulating film provided above said interconnection, said insulating film being provided with a hole reaching said interconnection;
a conductive film made contact with said interconnection in a bottom of said hole, said conductive film being formed across from said bottom of said hole to outside said hole; and
a solder ball provided in contact with said conductive film and said insulating film,
wherein when "a" is distance between a terminal part of the solder ball in a face made contact with said insulating film and an upper periphery of said hole, and "b" is depth of said hole, value of a/b is not more than 2.

2. The semiconductor device according to claim 1, further comprising an alloy layer containing a first metallic element contained in said solder ball and a second metallic element contained in said conductive film between said solder ball and said conductive film.

3. The semiconductor device according to claim 1, wherein said insulating film includes a protection film provided above said interconnection and a stress buffer resin layer provided above said protection film; an elastic modulus of said stress buffer resin layer is from not less than 1 GPa to not more than 5 GPa.

4. The semiconductor device according to claim 3, wherein said stress buffer resin layer is composed of polyimide or polybenzoxazole.

5. The semiconductor device according to claim 3, a thickness of said stress buffer resin layer is from not less than 1 μm to not more than 10 μm.

6. The semiconductor device according to claim 1, wherein said solder ball is composed of a lead-free solder containing Sn.

7. The semiconductor device according to claim 1, wherein a surface part of said conductive film contains copper or nickel.

8. The semiconductor device according to claim 1, wherein said solder ball is formed so as to cover said conductive film.

9. A semiconductor device comprising:
an interconnection;
an insulating layer comprising a protection layer provided above said interconnection and a stress buffer resin layer provided above the protection film, said insulating film being provided with a hole reaching said interconnection;
a conductive film made contact with said interconnection and extending outside said hole on said insulating layer; and a solder ball provided in contact with said conductive film and said buffer resin layer, wherein said conductive film includes a ball underlying metal film made contact with said solder ball, and a barrier metal film provided between said interconnection and said ball underlying metal film; when "c" is distance between a terminal part of said ball underlying metal film and an upper periphery of said hole, and "b" is depth of said hole, value of c/b is not more than 1.3.

10. The semiconductor device according to claim 9, further comprising an alloy layer containing a first metallic element contained in said solder ball and a second metallic element contained in said conductive film between said solder ball and said conductive film.

11. The semiconductor device according to claim 9, wherein said insulating film includes a protection film provided above said interconnection and a stress buffer resin layer provided above said protection film; an elastic modulus of said stress buffer resin layer is from not less than 1 GPa to not more than 5 GPa.

12. The semiconductor device according to claim 11, wherein said stress buffer resin layer is composed of polyimide or polybenzoxazole.

13. The semiconductor device according to claim 11, a thickness of said stress buffer resin layer is from not less than 1 μm to not more than 10 μm.

14. The semiconductor device according to claim 9, wherein said solder ball is composed of a lead-free solder containing Sn.

15. The semiconductor device according to claim 9, wherein a surface part of said conductive film contains copper or nickel.

16. The semiconductor device according to claim 9, wherein said solder ball is formed so as to cover said conductive film.

* * * * *